(12) United States Patent
Nakamura et al.

(10) Patent No.: US 8,035,225 B2
(45) Date of Patent: Oct. 11, 2011

(54) SEMICONDUCTOR CHIP ASSEMBLY AND FABRICATION METHOD THEREFOR

(75) Inventors: Kojiro Nakamura, Osaka (JP); Hidenobu Nishikawa, Nara (JP); Kentaro Kumazawa, Osaka (JP)

(73) Assignee: Panasonic Corporation, Osaka (JP)

( * ) Notice: Subject to any disclaimer, the term of this patent is extended or adjusted under 35 U.S.C. 154(b) by 175 days.

(21) Appl. No.: 11/722,925

(22) PCT Filed: Dec. 28, 2005

(86) PCT No.: PCT/JP2005/024052
§ 371 (c)(1),
(2), (4) Date: Aug. 30, 2007

(87) PCT Pub. No.: WO2006/070863
PCT Pub. Date: Jun. 7, 2006

(65) Prior Publication Data
US 2008/0150133 A1 Jun. 26, 2008

(30) Foreign Application Priority Data
Dec. 28, 2004 (JP) ................. 2004-379604

(51) Int. Cl.
*H01L 23/52* (2006.01)
(52) U.S. Cl. . 257/737; 257/738; 257/686; 257/E23.023; 438/109; 438/108; 438/112
(58) Field of Classification Search ............... 257/737, 257/738, 686 E23.023; 438/109, 108, 112
See application file for complete search history.

(56) References Cited

U.S. PATENT DOCUMENTS

| 6,677,677 | B2 | 1/2004 | Kimura et al. | |
| 6,966,964 | B2 | 11/2005 | Nakamura et al. | |
| 2003/0060035 | A1* | 3/2003 | Kimura et al. | 438/626 |
| 2003/0092326 | A1* | 5/2003 | Nishikawa et al. | 439/894 |
| 2003/0138993 | A1 | 7/2003 | Nakamura et al. | |

FOREIGN PATENT DOCUMENTS

| JP | 2001 85605 | 3/2001 |
| JP | 2001 326322 | 11/2001 |
| JP | 2003 100801 | 4/2003 |
| JP | 2003 197853 | 7/2003 |

OTHER PUBLICATIONS

English language Abstract of JP 2003-197853.
English language Abstract of JP 2001-326322.
English language Abstract of JP 2001-85605.
English language Abstract of JP 2003-100801.

* cited by examiner

*Primary Examiner* — Junghwa M Im
(74) *Attorney, Agent, or Firm* — Greenblum & Bernstein, P.L.C.

(57) ABSTRACT

A semiconductor chip dual-sided assembly which has a higher degree of reliability of connections between semiconductor chips and a circuit substrate is realized. This is achieved by the assembly including a plurality of upper side pads (2a) provided on a substrate upper surface (1a); a plurality of lower side pads (2b) provided on a substrate lower surface (1b) corresponding to the upper side pads (2a) across the substrate (1), respectively; a first semiconductor chip (4) having first bumps (8a) joined to the upper side pads (2a), respectively; and a second semiconductor chip (5) having second bumps (8b) joined to the lower side pads (2b), respectively.

5 Claims, 7 Drawing Sheets

SEMICONDUCTOR CHIP ASSEMBLY AND FABRICATION METHOD THEREFOR

TECHNICAL FIELD

The present invention relates to semiconductor chip assemblies. In particular, the invention relates to a semiconductor chip assembly with semiconductor chips mounted onto both surfaces of a circuit substrate, and to a fabrication method therefor.

BACKGROUND ART

Technological advancement of semiconductor processes toward finer design rules has made progress in realizing memory devices with higher capacities. In such a background, some solid-state memories such as flash memories are now available in place of magnetic recording media or optical recording media, which have been conventionally employed as recording media. Their example applications include IC cards or memory cards such as for digital cameras as well as secure SD (Secure Digital) cards, which have become widespread. These memory cards are increasingly demanded for higher capacities toward the future in order to record more information such as music or video images.

The memory cards are compact and thin in size. Thus, to accommodate a high-capacity memory therein, semiconductor chips are mounted by three-dimensional mounting or double-side bare chip mounting. Now, an example of such an assembly (for example, see Patent Document 1) will be described with reference to FIGS. 8A to 8G and FIG. 9.

FIGS. 8A to 8G are longitudinal sectional side views illustrating a fabrication method for dual-side mounting of semiconductor chips using the conventional flip-chip mounting technology. In addition, FIG. 9 is a longitudinal sectional front view illustrating an assembly with semiconductor chips mounted onto both surfaces of a circuit substrate using the flip-chip mounting technology. Note that in FIG. 8A to FIG. 8G and FIG. 9, like components are indicated with like symbols.

To begin with, as shown in FIG. 8A, a thermosetting adhesive 3 comprising epoxy is applied onto an upper surface 1a of a circuit substrate 1 which has a plurality of substrate electrodes 2 formed at their respective predetermined positions in the circuit on both the surfaces thereof.

At this time, the thermosetting adhesive 3 is applied so as to cover the plurality of substrate electrodes 2 on the upper surface 1a. On the other hand, as shown in FIG. 8B, a semiconductor chip 4 to be mounted has a plurality of electrode pads 7 provided on its bottom surface. On the electrode pads 7, bumps 8 are formed which melt together with the raw material thereof into an alloy to be thereby firmly fixed thereto. The semiconductor chip 4, which is securely vacuumed with a vacuum suction head 10, is fed onto the circuit substrate 1, and then pushed slightly against the thermosetting adhesive 3 with the bumps 8 aligned with the substrate electrodes 2, thereby being temporarily fixed onto the upper surface 1a via the adhesive 3 as shown in FIG. 8C.

As shown in FIG. 8D, the circuit substrate 1 having the aforementioned semiconductor chip 4 temporarily fixed to the upper surface 1a is turned upside down in the same step, and then the thermosetting adhesive 3 is applied to a lower surface 1b that faces upwardly. Subsequently, as shown in FIG. 8E, another semiconductor chip 4, which is securely vacuumed with the vacuum suction head 10, is fed onto the lower surface 1b of the circuit substrate 1. This semiconductor chip 4 is pushed slightly against the thermosetting adhesive 3 with the bumps 8 aligned with the substrate electrodes 2, thereby being temporarily fixed onto the lower surface 1b via the adhesive 3.

The circuit substrate 1 which has the semiconductor chips 4 temporarily fixed to the upper surface 1a and the lower surface 1b respectively as described above is fed to the next step. Then, as shown in FIG. 8F, the two semiconductor chips 4 temporarily fixed to the upper surface 1a and the lower surface 1b of the circuit substrate 1 are pressed under heat for approximately 30 seconds with heating and pressing heads 11 toward both the upper and lower surfaces of the circuit substrate 1. As shown in FIG. 8G, this causes the thermosetting adhesive 3 applied to both the mount surfaces 1a and 1b of the circuit substrate 1 to be simultaneously hardened under heat and contracted. This contractive force causes the two semiconductor chips 4 to be entirely pulled toward the opposing mount surfaces 1a and 1b of the circuit substrate 1, thus allowing each of the bumps 8 to be fixedly attached under pressure to the corresponding substrate electrodes 2, respectively, and thereby electrically connected thereto. In addition to this, each of the semiconductor chips 4 is firmly adhered to the mount surfaces 1a and 1b with the adhesive 3 which has been filled and hardened under heat in the entire gap between the opposing mount surfaces 1a and 1b of the circuit substrate 1. As such, the assembly is completed as shown in FIG. 9.

[Patent Document 1] Japanese Patent Laid-Open Publication No. 2003-197853

DISCLOSURE OF THE INVENTION

Problems to be Solved by the Invention

However, there is a serious problem with the aforementioned conventional structure. That is, as exaggerated in FIG. 9 for purposes of illustration, in the step of pressing the semiconductor chip 4 under heat against the circuit substrate 1, the bumps 8 may badly deflect and deform the substrate electrodes 2 and the circuit substrate 1. This may cause a break to occur in the substrate electrodes 2 and the electrical connection between the semiconductor chip 4 and the substrate electrodes 2 to be ruined, thus resulting in decreased yields. Additionally, variations in the bond heights of the bumps 8, which are indicated with heights A and B in FIG. 9, also result in troubles such as degradation in quality of the bonds or defective bonds.

It is therefore an object of the present invention to provide a semiconductor chip assembly which is capable of solving the aforementioned conventional problems.

Means for Solving the Problems

In order to achieve the aforementioned object, a semiconductor chip assembly according to the present invention includes: a plurality of upper side pads provided on a substrate upper surface; a plurality of lower side pads provided on a substrate lower surface respectively corresponding to the upper side pads across the substrate; a first semiconductor chip joined to the upper side pads and having first bumps; and a second semiconductor chip joined to the lower side pads and having second bumps.

According to the present invention, the upper side pads and the lower side pads of the substrate are provided at corresponding positions, respectively. Thus, when the first semiconductor chip is mounted under pressure and heat onto the upper side pads and the second semiconductor chip onto the lower side pads, the directions of pressure application toward the substrate are aligned with each other in the vertical direction to cancel out both the pressure loads applied. This cancellation of applied pressure makes it possible to prevent the substrate electrodes and the circuit substrate from being deflected and deformed during bonding of the semiconductor chips.

Furthermore, in the aforementioned arrangement, the second bump may be bonded to the lower side pad corresponding to the upper side pad to which the first bump is bonded, and a spacer may be bonded to a non-conducting pad which is provided on the semiconductor chip and connected to no wiring circuit. This arrangement allows the pressure loads applied in the upward and downward directions toward the substrate to be canceled out even at a portion, where no electrical conductivity is required between the semiconductor chip and the substrate, in the same manner as at other portions. This makes it possible to prevent the substrate electrodes and the circuit substrate from being deflected and deformed during mounting of the semiconductor chips.

Furthermore, in the aforementioned arrangement, the same effects can be provided by forming the spacer of a dummy bump, a dummy pad, or a combination of a dummy bump and a dummy pad.

Furthermore, the substrate may be a filler-mixing hard-type substrate which has a thickness of 0.15 mm or less. This makes it possible to realize a semiconductor chip assembly which has an appropriate strength and is advantageously reduced in size, thickness, and weight.

Furthermore, a fabrication method for a semiconductor chip assembly according to the present invention includes: providing a substrate having a plurality of upper side pads disposed on a substrate upper surface and a plurality of lower side pads disposed on a substrate lower surface corresponding to the upper side pads across the substrate, respectively; temporarily fixing a first semiconductor chip onto the substrate, the first semiconductor chip having a plurality of electrode pads with first bumps bonded thereto, with each first bump aligned with each upper side pad; temporarily fixing a second semiconductor chip onto the substrate, the second semiconductor chip having a plurality of electrode pads with second bumps bonded thereto, with each second bump aligned with each lower side pad; and pressing each of the first and second semiconductor chips toward the substrate under heat.

According to the present invention, the upper side pads and the lower side pads of the substrate are positioned so as to correspond to each other, respectively. Thus, when the first semiconductor chip and the second semiconductor chip are mounted onto the upper side pads and the lower side pads under pressure and heat, respectively, the directions of pressure application toward the substrate are aligned with each other in the vertical direction, thereby allowing both the pressure loads applied to be canceled out. This makes it possible to prevent the substrate electrodes and the circuit substrate from being deflected and deformed during mounting of the semiconductor chips.

Furthermore, another semiconductor chip assembly according to the present invention includes: a first semiconductor chip having a plurality of electrode pads and a non-conducting pad connected to no wiring circuit; a second semiconductor chip having a plurality of electrode pads and a non-conducting pad connected to no wiring circuit; and a substrate having upper side pads provided at positions corresponding to the electrode pads of the first semiconductor chip and lower side pads provided at positions corresponding to the electrode pads of the second semiconductor chip. In this assembly, the upper side pads and the electrode pads are bonded together via the first bumps, respectively, the lower side pads and the electrode pads are bonded together via the second bumps, respectively, and the non-conducting pads and the substrate are bonded together via the dummy bumps, respectively. In this arrangement, the directions of pressure application toward the substrate are aligned with each other in the vertical direction, thereby allowing both the pressure loads applied to be canceled out. This makes it possible to prevent the substrate electrodes and the circuit substrate from being deflected and deformed during mounting of the semiconductor chips.

A fabrication method for another semiconductor chip assembly according to the present invention includes: temporarily fixing a first semiconductor chip onto a substrate, the first semiconductor chip having a plurality of electrode pads with first bumps bonded thereto, the first semiconductor chip also having a non-conducting pad with a dummy bump bonded thereto and no wiring circuit connected thereto, with the first bumps aligned with the upper side pads on the substrate upper surface; temporarily fixing a second semiconductor chip onto the substrate, the second semiconductor chip having a plurality of electrode pads with second bumps bonded thereto, the second semiconductor chip also having a non-conducting pad with a dummy bump bonded thereto and no wiring circuit connected thereto, with the second bumps aligned with the lower side pads on the substrate lower surface; and pressing each of the first and second semiconductor chips toward the substrate under heat, thereby allowing the dummy bumps joined to the non-conducting pads to be directly bonded to the substrate. This method also allows for vertically aligning, across the substrate, the pressure loads applied in the upward and downward directions toward the substrate to thereby cancel out both the pressure loads applied. This makes it possible to prevent the substrate electrodes and the circuit substrate from being deflected and deformed during bonding of the semiconductor chips.

Furthermore, still another semiconductor chip assembly according to the present invention includes: a first semiconductor chip having two electrode pads disposed in close proximity to each other at one end portion and having one electrode pad disposed at the other end; a second semiconductor chip having one electrode pad at one end portion and two electrode pads disposed in close proximity to each other at the other end; and a substrate having upper side pads provided at positions corresponding to the electrode pads of the first semiconductor chip and lower side pads provided at positions corresponding to the electrode pads of the second semiconductor chip. In this assembly, the upper side pads and the electrode pads are bonded together via the first bumps, respectively, and the lower side pads and the electrode pads are bonded together via the second bumps, respectively. At one end portion of the substrate, the midpoints between the two electrode pads and between the two upper side pads on the substrate upper surface align, on a line orthogonal to the substrate, with the centers of width of the electrode pad and the lower side pad on the substrate lower surface. At the other end portion of the substrate, the centers of width of the electrode pad and the upper side pad on the substrate upper surface align, on a line orthogonal to the substrate, with the midpoints between the two electrode pads and between the two lower side pads on the substrate lower surface. In this arrangement, the directions of pressure application toward the substrate are aligned with each other in the vertical direction, thereby allowing both the pressure loads applied to be canceled out. This makes it possible to prevent the substrate electrodes and the circuit substrate from being deflected and deformed during bonding of the semiconductor chips.

A fabrication method for still another semiconductor chip assembly according to the present invention includes: temporarily fixing a first semiconductor chip onto a substrate, the first semiconductor chip having two electrode pads disposed in close proximity to each other at one end portion, the electrode pads having first bumps bonded thereto, the first semiconductor chip also having one electrode pad disposed at the other end, the electrode pad having a first bump bonded thereto, with the first bumps aligned with upper side pads on the substrate upper surface; temporarily fixing a second semiconductor chip onto the substrate, the second semiconductor chip having one electrode pad disposed at one end portion, the electrode pad having a second bump bonded thereto, the second semiconductor chip also having two electrode pads disposed in close proximity to each other at the other end, the electrode pads having second bumps bonded thereto, with the second bumps aligned with lower side pads on the substrate lower surface; and pressing each of the first and second semiconductor chips toward the substrate under heat. At one end portion of the substrate, the midpoints between the two electrode pads and between the two upper side pads on the substrate upper surface align, on a line orthogonal to the substrate, with the centers of width of the electrode pad and the lower side pad on the substrate lower surface. At the other end portion of the substrate the centers of width of the electrode pad and the upper side pad on the substrate upper surface align, on a line orthogonal to the substrate, with the midpoints between the two electrode pads and between the two lower side pads on the substrate lower surface. This method also allows for vertically aligning, across the substrate, the pressure loads applied in the upward and downward directions toward the substrate to thereby cancel out both the pressure loads applied. This makes it possible to prevent the substrate electrodes and the circuit substrate from being deflected and deformed during bonding of the semiconductor chips.

BEST MODE FOR CARRYING OUT THE INVENTION

Now, the present invention will be described below in more detail with reference to the accompanying drawings in accordance with the embodiments.

First Embodiment

Figure 1:
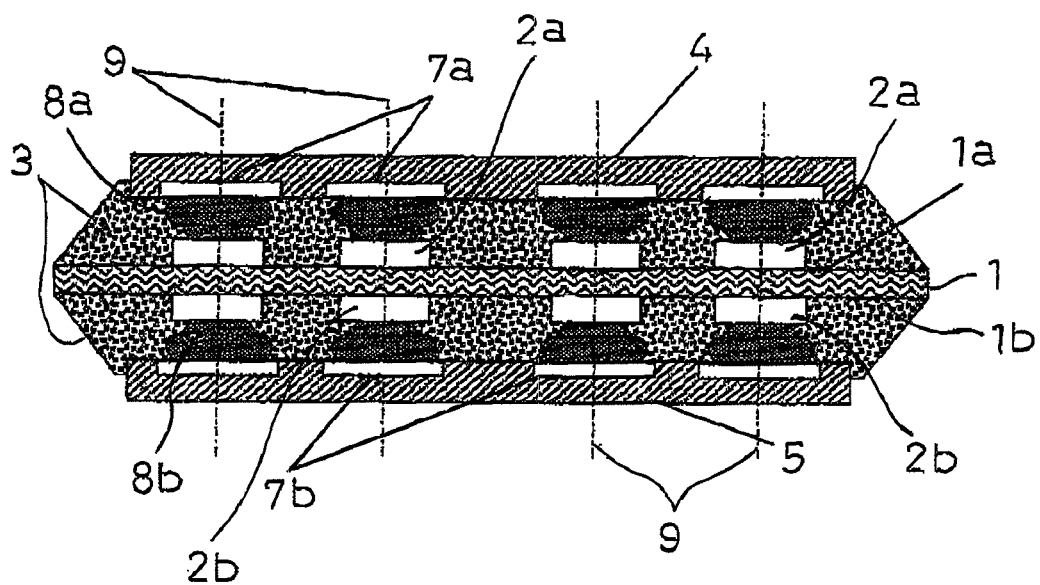
FIG. 1 is a longitudinal sectional front view illustrating a semiconductor chip assembly according to a first embodiment of the present invention.

FIG. 1 is a longitudinal sectional front view illustrating a semiconductor chip dual-sided assembly according to a first embodiment. As shown in FIG. 1, a semiconductor chip 4 is mounted by flip-chip mounting technology such as SBB (Stud Bump Bonding) or using ACF (Anisotropic conductive Film) onto an upper surface 1a of a multi-layered resin circuit substrate 1 which is formed of a glass fiber or aramid fiber and an epoxy resin. Subsequently, a semiconductor chip 5 is also mounted onto a lower surface 1b or the backside of the circuit substrate. Upper and lower side pads 2a and 2b and first and second bumps 8a and 8b provide electrical and mechanical connections between the semiconductor chip 4 and the substrate upper surface 1a and between the semiconductor chip 5 and the substrate lower surface 1b. These pads 2a and 2b and bumps 8a and 8b are bonded together to pair those on the substrate upper surface 1a with those on the substrate lower surface 1b, so that their respective bond centers 9 are vertically overlapped (aligned) across the substrate 1. That is, as shown in FIG. 1, the semiconductor chip assembly of the first embodiment includes the plurality of upper side pads 2a provided on the substrate upper surface 1a; the plurality of lower side pads 2b provided on the substrate lower surface 1b corresponding to the upper side pads 2a across the substrate 1, respectively; the first semiconductor chip 4 having the plurality of first bumps 8a joined to the upper side pads 2a, respectively, and the second semiconductor chip 5 having the plurality of second bumps 8b joined to the lower side pads 2b, respectively.

Now, a fabrication method for a semiconductor chip dual-sided assembly according to the first embodiment will be described with reference to FIGS. 2A to 3B. FIGS. 2A to 2D and FIGS. 3A to 3B are longitudinal sectional front views illustrating a fabrication method for dual-side mounting of semiconductor chips using the flip-chip mounting technology.

Figure 2A:
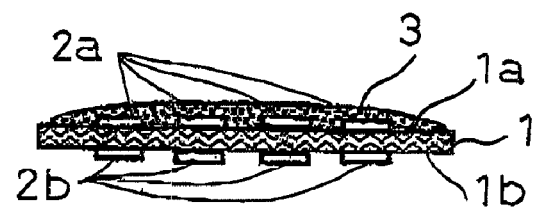
FIGS. 2A to 2D are views illustrating fabrication steps, in the order in which they are performed, for an assembly according to the embodiment which has semiconductor chips mounted by flip-chip technique onto both surfaces of a circuit substrate.
Figure 2B:
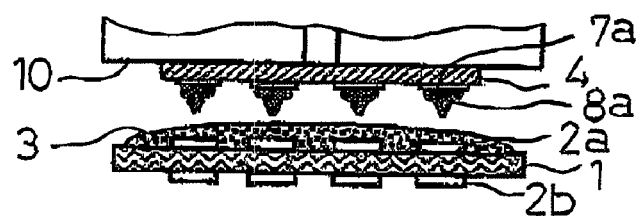
Figure 2C:
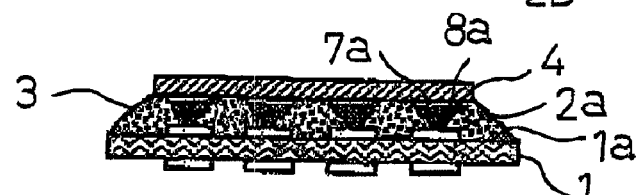

To begin with, as shown in FIG. 2A, a thermosetting adhesive 3 of epoxy is applied onto the upper surface 1a of the circuit substrate 1 which has the upper side pads 2a and the lower side pads 2b formed at a plurality of their respective predetermined positions in the circuit on the upper and lower surfaces 1a and 1b. At this time, the thermosetting adhesive 3 is applied so as to cover the upper side pads 2a on the upper surface 1a. On the other hand, as shown in FIG. 2B, the semiconductor chip 4 to be mounted has electrode pads 7a provided on a surface thereof. On the electrode pads 7a, the bumps 8a are formed which melt together with the raw material thereof into an alloy to be thereby firmly fixed thereto. The semiconductor chip 4, which is securely vacuumed with a vacuum suction head 10, is fed onto the circuit substrate 1, and then pushed slightly against the thermosetting adhesive 3 with the bumps 8a aligned with the upper side pads 2a, thereby being temporarily fixed onto the upper surface 1a via the adhesive 3 as shown in FIG. 2C.

Figure 2D:
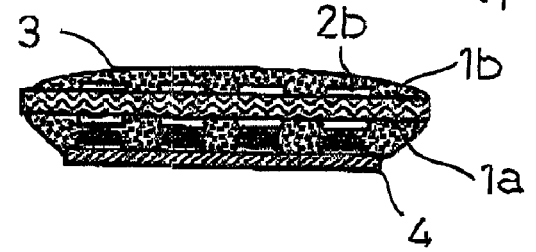
Figure 3A:
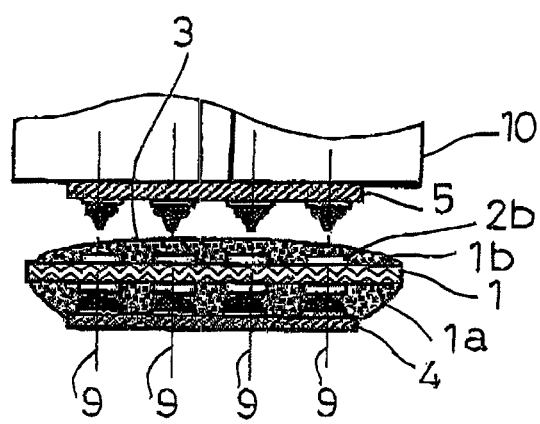
FIGS. 3A to 3B are views illustrating fabrication steps, in the order in which they are performed, for an assembly according to the embodiment which has semiconductor chips mounted by flip-chip technique onto both surfaces of a circuit substrate.

As shown in FIG. 2D, the circuit substrate 1 having the aforementioned semiconductor chip 4 temporarily fixed to the upper surface 1a is turned upside down in the same step, and then the thermosetting adhesive 3 is applied onto the lower surface 1b that faces upwardly. Subsequently, as shown in FIG. 3A, another semiconductor chip 5, which is securely vacuumed with a vacuum suction head 10, is fed onto the lower surface 1b of the circuit substrate 1. Then, the semiconductor chip 5 is disposed such that each of the bond centers 9 of the semiconductor chip 4 on the substrate upper surface 1a is overlapped (aligned) with each of the bond centers 9 of the semiconductor chip 5 on the substrate lower surface 1b, respectively. With the semiconductor chip 4 aligned with the semiconductor chip 5 to oppose each other across the circuit substrate 1, the semiconductor chips are pushed slightly against the thermosetting adhesive 3, thereby being temporarily fixed onto the upper and lower surfaces 1a and 1b of the substrate via the adhesive 3, respectively.

Figure 3B:
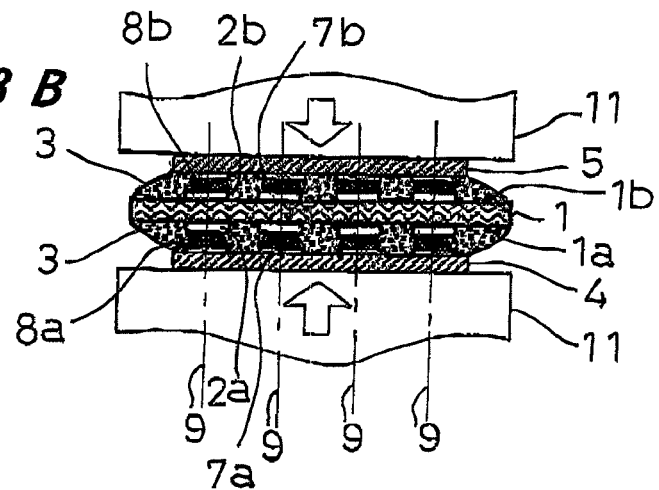

The circuit substrate 1 which has the semiconductor chips 4 and 5 temporarily fixed respectively to the upper and lower surfaces 1a and 1b of the substrate as described above is fed to the next step. Then, as shown in FIG. 3B, the two semiconductor chips 4 and 5 temporarily fixed to the upper and lower surfaces 1a and 1b of the circuit substrate 1 are pressed under heat for about 30 seconds with the heating and pressing heads 11 in both the upward and downward directions toward the circuit substrate 1. In this pressing step, the bonds between the upper side pads 2a on the substrate upper surface 1a and the bumps 8a and the bonds between the lower side pads 2b on the substrate lower surface 1b and the bumps 8b are provided at their corresponding positions across the substrate 1, respectively. Accordingly, the direction of pressure is aligned with the bond centers 9 across the substrate 1 in the vertical direction, thereby allowing the pressure loads applied in the upward and downward directions toward the substrate 1 to be canceled out. This cancellation of pressure makes it possible to mount the semiconductor chips 4 and 5 onto the circuit substrate 1 without causing the circuit substrate 1, the upper side pads 2a, and the lower side pads 2b to be deflected and deformed. Then, the thermosetting adhesive 3 applied to both the upper and lower mount surfaces 1a and 1b of the circuit substrate 1 is simultaneously hardened under heat and contracted. This contractive force causes the two semiconductor chips 4 and 5 to be entirely pulled toward the corresponding mount surfaces 1a and 1b of the circuit substrate 1, thus allowing the first and second bumps 8a and 8b to be fixedly attached under pressure to their respectively corresponding upper and lower side pads 2a and 2b and thereby electrically connected thereto. Additionally, each of the semiconductor chips 4 and 5 is firmly adhered to the mount surfaces 1a and 1b with the adhesive 3 which has been filled and hardened under heat in the entire gap between the corresponding mount surfaces 1a and 1b of the circuit substrate 1. As such, the assembly is completed as shown in FIG. 1.

Note that for the aforementioned semiconductor chip assembly, the mounting may not be performed by flip-chip mounting but by face-up bare chip mounting. Additionally, as the fabrication method, the mounting may not be sequentially performed on the upper surface 1a and the lower surface 1b but may also be performed at the same time on both the surfaces.

Second Embodiment

Now, a semiconductor chip dual-sided assembly according to a second embodiment will be described with reference to FIG. 4. Note that the same members as those described in the first embodiment will be labeled with the same reference symbols and only different points therebetween will be mainly described in detail. The semiconductor chip assembly of the first embodiment is configured such that all the electrode pads 7a and 7b provided on the first semiconductor chip 4 and the second semiconductor chip 5 are connected to the substrate 1 with the intervention of the upper side pads 2a and the first bumps 8a or the lower side pads 2b and the second bumps 8b. However, there are some trace patterns which include an electrode pad (non-conducting pad) to which no conductors are connected. In this embodiment, such a non-conducting pad is a non-conducting pad 7c on the first semiconductor chip 4 and a non-conducting pad 7d on the second semiconductor chip 5. Here, a pressure load may be applied in the upward and downward directions toward the substrate 1 without the provision of bumps and pads between the non-conducting pad 7c or 7d having no conductors connected thereto and the substrate 1. In this case, in such a portion where bumps and pads exist only on either side surface of the substrate 1, the substrate 1 would be likely to badly deflect and deform due to the difference between the pressure loads applied in the upward and downward directions toward the substrate 1. In this context, a spacer that has nothing to do with the functional operation of the assembly is provided between the non-conducting pad 7c or 7d and the substrate 1, thereby canceling out the pressure loads applied in the upward and downward directions toward the substrate 1 to prevent the substrate 1 from being deflected and deformed.

Figure 4:
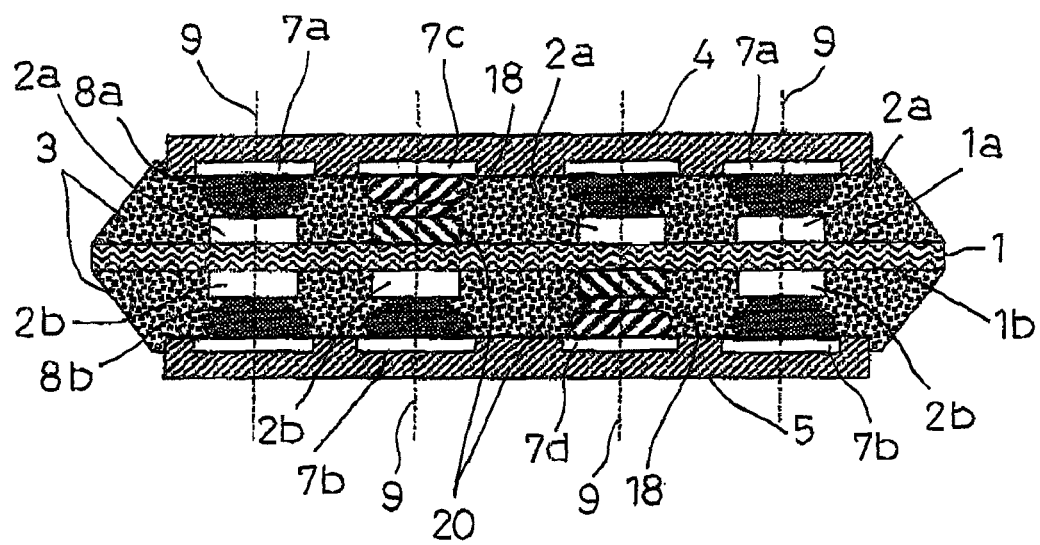
FIG. 4 is a longitudinal sectional front view illustrating a semiconductor chip assembly according to a second embodiment of the present invention.

In the example shown in FIG. 4, a dummy pad 20 and a dummy bump 18, which serve as a spacer, are provided between the non-conducting pad 7c and the substrate 1. Likewise, another dummy pad 20 and another dummy bump 18, which also serve as a spacer, are provided between the non-conducting pad 7d and the substrate 1. The dummy pad 20 on the substrate lower surface 1b is provided at a position corresponding to the upper side pad 2a across the substrate 1, whereas the dummy pad 20 on the substrate upper surface 1a is provided at a position corresponding to the lower side pad 2b across the substrate 1. The dummy pad 20 and the dummy bump 18 have nothing to do with functional operation of the assembly. However, the dummy pad 20 is formed of the same material in the same structure as the upper and lower side pads 2a and 2b, while the dummy bump 18 is formed of the same material in the same structure as the first and second bumps 8a and 8b. Thus, this allows for performing bonding evenly under pressure in the heating and pressing step, never causing such problems as dislocation or deformation. Such a structure as having a spacer between the non-conducting pad 7c or 7d and the substrate 1 in this manner allows each of the bond centers 9 of the first semiconductor chip 4 and each of the bond centers 9 of the second semiconductor chip 5 to be positioned so that they are overlapped (aligned) corresponding to each other across the substrate 1, respectively. Thus, during the heating and pressing in the fabrication step of the semiconductor chip dual-sided assembly, the pressure loads applied in the vertical direction toward the substrate 1 are canceled out. This makes it possible to prevent the circuit substrate 1, upper side pads 2c, and lower side pads 2d from being deformed, and prevent breaks in the traces of the circuit substrate 1 and variations in height of the bonds of the bumps 8a and 8b. It is thus possible to provide an assembly with a high bonding reliability.

Note that in the aforementioned example, such a structure has been described to which a combination of the dummy bump 18 and the dummy pad 20 is applied as an example of a spacer. The same effects can also be provided by other structures than this, such as those in which only the dummy pad 20 is used to bond the typical bumps 8a and 8b thereto or the dummy bump 18 is bonded to the typical upper and lower side pads 2a and 2b.

Third Embodiment

Figure 5:
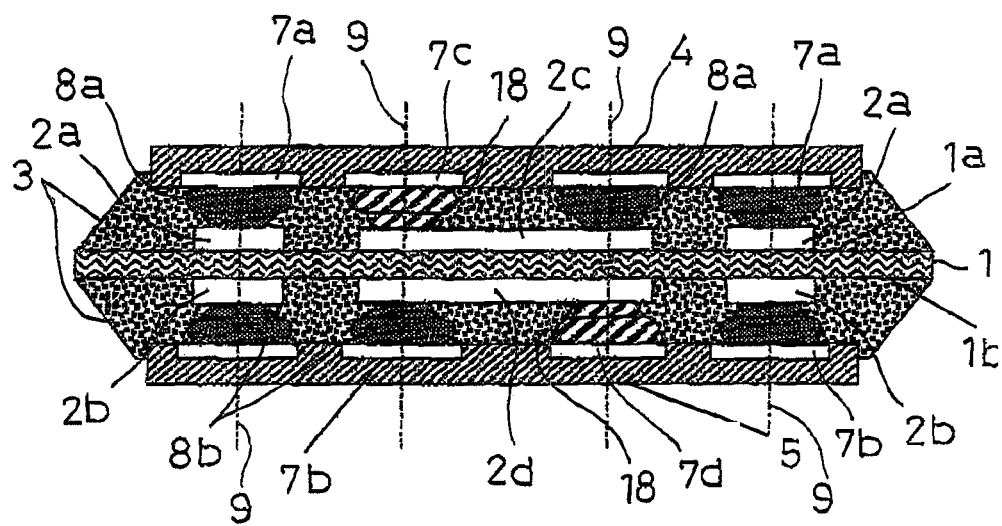
FIG. 5 is a longitudinal sectional front view illustrating a semiconductor chip assembly according to a third embodiment of the present invention.

Now, a semiconductor chip dual-sided assembly according to a third embodiment will be described with reference to FIG. 5. Note that the same members as those described above will be labeled with the same reference symbols and only different points therebetween will be mainly described in detail. In the example shown in FIG. 5, the first semiconductor chip 4 has the non-conducting pad 7c provided at one location, while the second semiconductor chip 5 has the non-conducting pad 7d also provided at one location. Here, this example significantly differs from the second embodiment by having an upper side pad 2c and a lower side pad 2d, which are wider enough to be capable of bonding to a plurality of adjacent bumps (8a and 18 or 8b and 18) and positioned at locations corresponding to each other across the substrate 1. On the substrate upper surface 1a, the wider upper side pad 2c is bonded to a dummy bump 18 and a first bump 8a, whereas on the substrate lower surface 1b, the wider lower side pad 2d is bonded to a second bump 8b and a dummy bump 18. Here, the dummy bumps 18 are provided as a spacer that has nothing to do with the functional operation of the assembly but are formed of the same material in the same structure as the first and second bumps 8a and 8b. This allows for performing bonding evenly under pressure in the heating and pressing step, never causing such problems as dislocation or deformation. The wider pads 2c and 2d that are capable of bonding to the plurality of adjacent bumps (8a and 18 or 8b and 18) are provided in this manner. Even in this case, the wider upper side pad 2c and lower side pad 2d are provided at locations corresponding to each other across the substrate 1, and the dummy bump 18 serving as a spacer is provided between the non-conducting pad 7c or 7d and the substrate 1. The bond centers 9 of the first semiconductor chip 4 and the bond centers 9 of the second semiconductor chip 5 are positioned so that they are overlapped (aligned) corresponding to each other across the substrate 1, respectively. Thus, during the heating and pressing in the fabrication step of the semiconductor chip dual-sided assembly, the pressure loads applied in the upward and downward directions toward the substrate 1 will be canceled out. This makes it possible to prevent the circuit substrate 1, the upper side pad 2c, and the lower side pad 2d from being deformed, and prevent breaks in the traces of the circuit substrate 1 and variations in height of the bonds of the bumps 8a and 8b. It is thus possible to provide an assembly with a high bonding reliability.

Fourth Embodiment

Figure 6:
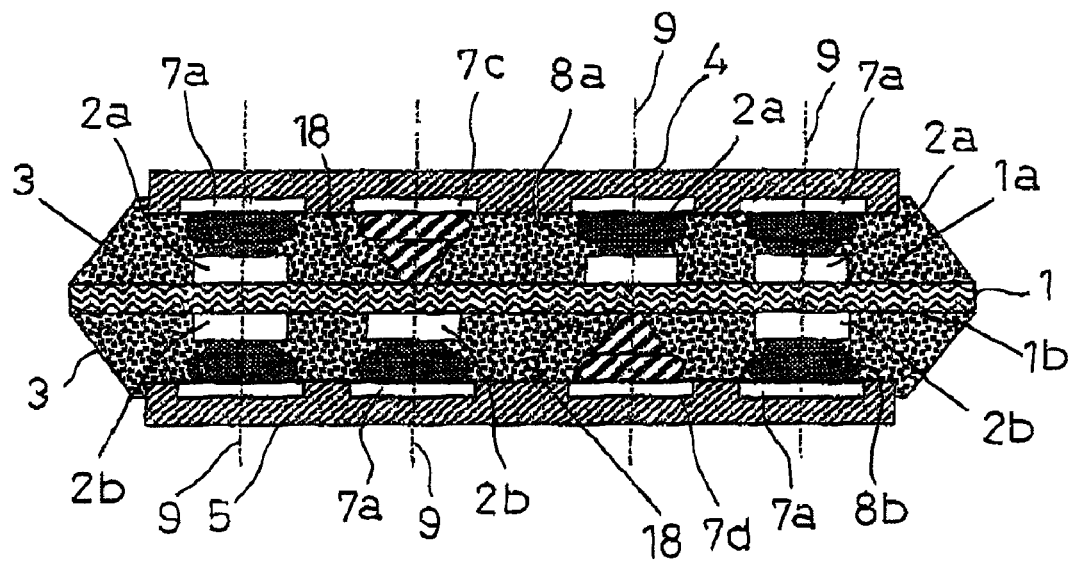
FIG. 6 is a longitudinal sectional front view illustrating a semiconductor chip assembly according to a fourth embodiment of the present invention.

Now, a semiconductor chip dual-sided assembly according to a fourth embodiment will be described with reference to FIG. 6. Note that the same members as those described above will be labeled with the same reference symbols and only different points therebetween will be mainly described in detail. FIG. 6 is a longitudinal sectional front view illustrating a semiconductor chip dual-sided assembly according to the fourth embodiment. In this assembly, the first semiconductor chip 4 has the non-conducting pad 7c provided at one location and the second semiconductor Chip 5 has the non-conducting pad 7d also provided at one location. These non-conducting pads 7c and 7d have a dummy bump 18 bonded thereto as a spacer. The difference from the aforementioned embodiment lies in that the dummy bump 18 is directly bonded to the substrate 1 without the intervention of the upper and lower side pads 2a and 2b or 2c and 2d, or a dummy pad 20 (see FIG. 4 and FIG. 5). Here, only the dummy bumps 18 are provided as a spacer that has nothing to do with the functional operation of the assembly. This arrangement allows each of the bond centers 9 corresponding to each other across the substrate 1 to be positioned so that they are overlapped (aligned) with each other across the substrate 1. Thus, during the heating and pressing in the fabrication step of the semiconductor chip dual-sided assembly, the pressure loads applied in the upward and downward directions toward the substrate 1 will be canceled out. This makes it possible to prevent the circuit substrate 1, the upper side pads 2a, and the lower side pads 2b from being deformed, and prevent breaks in the traces of the circuit substrate 1 and variations in height of the bonds of the bumps 8a and 8b. It is thus possible to provide an assembly with a high bonding reliability.

Fifth Embodiment

Figure 7:
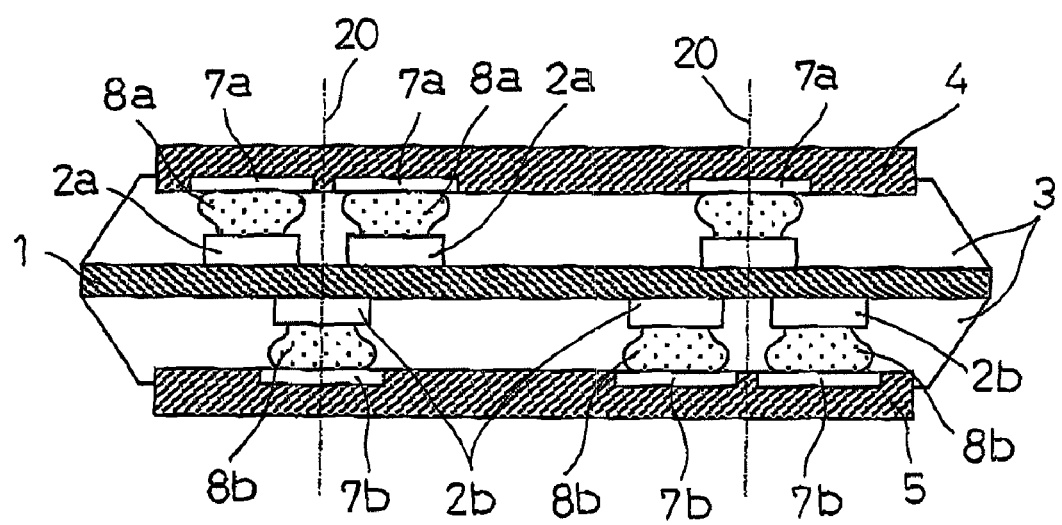
FIG. 7 is a longitudinal sectional front view illustrating a semiconductor chip assembly according to a fifth embodiment of the present invention.
Figure 8:
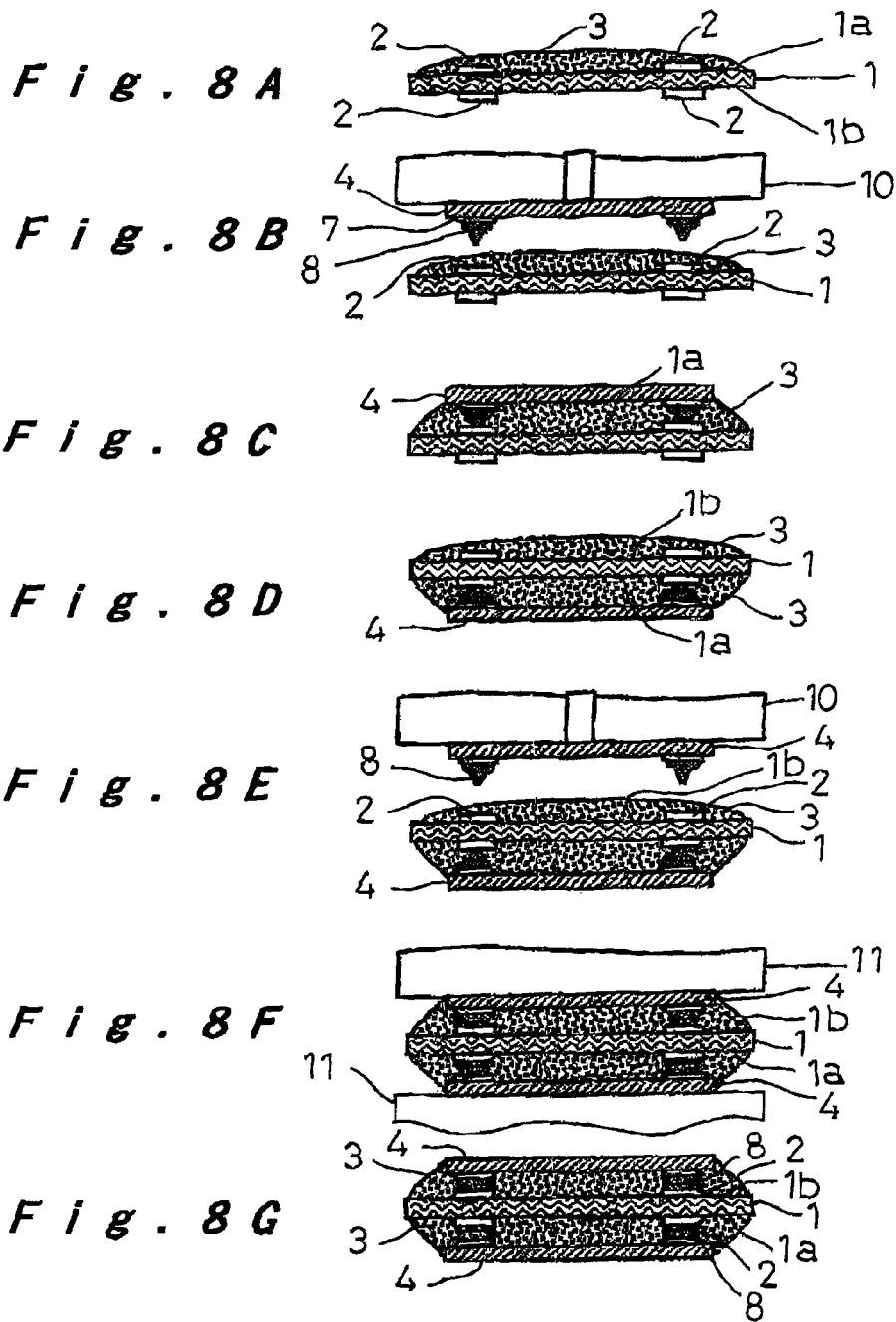
FIGS. 8A to 8G are longitudinal sectional views illustrating an example of conventional fabrication steps, in the order in which they are performed, for an assembly which has semiconductor chips mounted by flip-chip technique onto both surfaces of a circuit substrate.
Figure 9:
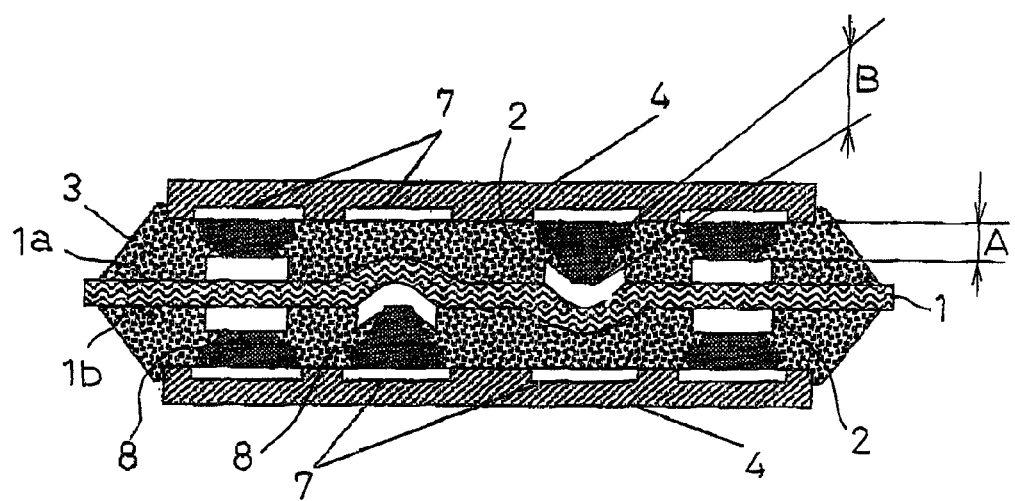
FIG. 9 is a longitudinal sectional front view illustrating an example of a conventional semiconductor chip assembly.

Now, a semiconductor chip dual-sided assembly according to a fifth embodiment will be described with reference to FIG. 7. Note that the same members as those described above will be labeled with the same reference symbols and only different points therebetween will be mainly described in detail. FIG. 7 is a longitudinal sectional front view illustrating a semiconductor chip dual-sided assembly according to the fifth embodiment of the present invention. On the left of FIG. 7, two upper side pads 2a are provided in close proximity to each other on the substrate upper surface 1a, while one lower side pad 2b is provided on the substrate lower surface 1b. On the right of FIG. 7, one upper side pad 2a is provided on the substrate upper surface 1a, while two lower side pads 2b are provided in close proximity to each other on the substrate lower surface 1b. Additionally, the first semiconductor chip 4 has the electrode pads 7a provided at a position corresponding to each of the upper side pads 2a on the substrate 1, while the second semiconductor chip 5 has the electrode pads 7b provided at a position corresponding to each of the lower side pads 2b on the substrate 1. Furthermore, the first bumps 8a are bonded between the electrode pads 7a of the first semiconductor chip 4 and the upper side pads 2a, respectively, while the second bumps 8b are bonded between the electrode pads 7b of the second semiconductor chip 5 and the lower side pads 2bt, respectively, What is important here is that on the left of the substrate 1, the midpoint between the two upper side pads 2a, the midpoint between the two electrode pads 7a of the first semiconductor chip 4, the center of width of the lower side pad 2b, and the center of width of the electrode pad 7b of the second semiconductor chip 5 are positioned so as to be overlapped (aligned) with each other on a bond line 20 as shown in the figure. What is also important is that on the right of the substrate 1, the center of width of the upper side pad 2a, the center of width of the electrode pad 7a of the first semiconductor chip 4, the midpoint between the two lower side pads 2b, and the midpoint between the two electrode pads 7b of the second semiconductor chip 5 are positioned so as to be overlapped (aligned) with each other on a bond line 20 as shown in the figure.

In this manner, the upper side pads 2a and the lower side pads 2b are provided in such a range in which the pressure loads applied in the upward and downward directions toward the substrate 1 are dynamically balanced. This arrangement eliminates the need for arranging their respective bond centers 9 at a position at which they are overlapped (aligned) with each other across the substrate 1. Thus, during the heating and pressing in the fabrication step of the semiconductor chip dual-sided assembly, the pressure loads applied in the upward and downward directions toward the substrate 1 will be canceled out. This makes it possible to prevent the circuit substrate 1, the upper side pads 2a, and the lower side pads 2b from being deformed, and prevent breaks in the traces of the circuit substrate 1 and variations in height of the bonds of the bumps 8a and 8b. It is thus possible to provide an assembly with a high bonding reliability. Note that in this embodiment, the description was made only to the structure shown in FIG. 7; however, the present invention is not limited to this. For example, two upper side pads 2a can be provided in close proximity to each other at each of the right and left end portions of the substrate upper surface 1a. Then, one lower side pad 2b can be disposed at each of the right and left end portions of the substrate lower surface 1b so that their center of width is overlapped (aligned) on the bond line 20 with the midpoint between the two upper side pads 2a at positions corresponding to each other across the substrate 1. Alternatively, two upper side pads 2a can be provided in close proximity to each other at each of the right and left end portions of the substrate upper surface 1a. Then, three lower side pads 2b can be disposed at each of the right and left end portions of the substrate lower surface 1b so that the center of the entire width of these three lower side pads 2b is overlapped (aligned) on the bond line 20 with the midpoint between the two upper side pads 2a disposed at a corresponding position across the substrate 1.

In the aforementioned embodiments, such examples have been described which employ the multi-layered resin circuit substrate 1 formed of a glass fiber or aramid fiber and an epoxy resin. However, as an alternative to this substrate, a multi-layered circuit substrate 1 of a filler-mixing hard-type may also be employed. As an example of filler, an inorganic filler may be employed which is predominantly composed of a metal hydroxide to which interface control has been provided. Use of a filler-mixing hard-type substrate would allow its thickness to be reduced down to approximately 0.15 to 0.10 mm, more preferably to approximately 0.04 mm. It is thus possible to realize an assembly which has an appropriate strength and which is advantageously reduced in size, thickness, and weight.

INDUSTRIAL APPLICABILITY

As described above, according to an assembly of the present invention, when the first and second semiconductor chips are pressed under heat against the substrate in the upward and downward directions toward the substrate, the directions of pressure application toward the substrate are aligned with each other in the vertical direction to cancel out both the pressure loads applied, thereby making it possible to prevent the substrate electrodes and the circuit substrate from being deflected and deformed during bonding of the semiconductor chips. Additionally, neither breaks in the traces of the substrate nor variations in height or bonds will occur, thereby allowing for realizing a dual-sided bare IC assembly or an assembly having semiconductor chips bonded to its both surfaces with a high bonding reliability. Accordingly, the assembly is suitably employed for electronic components such as CSPs (Chip Size Packages) which are packaged in the same size as the semiconductor chip and MCMs (Multi Chip Module) which have a plurality of semiconductor chips mounted onto a circuit substrate.

The invention claimed is:

1. A semiconductor chip assembly comprising:
   a plurality of upper side pads provided on a substrate upper surface;
   a plurality of lower side pads provided on a substrate lower surface respectively corresponding to the upper side pads across the substrate;
   a first semiconductor chip joined to the upper side pads and having first bumps which bond to the upper side pads; and
   a second semiconductor chip joined to the lower side pads and having second bumps which bond to the lower side pads,
   wherein at least one of the first and second semiconductor chips is provided with a non-conducting pad that is not connected to a wiring circuit,
   a spacer is bonded between the non-conducting pad and the substrate, the spacer being formed of a combination of a dummy bump and a dummy pad,
   each of the upper side pads opposes one of the lower side pads or a dummy pad provided on the substrate lower surface, and
   each of the lower side pads opposes one of the upper side pads or a dummy pad provided on the substrate upper surface.

2. The semiconductor chip assembly according to claim 1, wherein the substrate is a filler-mixing hard-type substrate which has a thickness of 0.15 mm or less.

3. A fabrication method for a semiconductor chip assembly, comprising:
   providing a substrate having a plurality of upper side pads disposed on a substrate upper surface and a plurality of lower side pads disposed on a substrate lower surface corresponding to the upper side pads across the substrate, respectively;
   temporarily fixing a first semiconductor chip onto the substrate, the first semiconductor chip having a plurality of electrode pads with first bumps bonded thereto, with each first bump aligned with each upper side pad;
   temporarily fixing a second semiconductor chip onto the substrate, the second semiconductor chip having a plurality of electrode pads with second bumps bonded thereto, with each second bump aligned with each lower side pad; and
   pressing each of the first and second semiconductor chips toward the substrate under heat,
   wherein at least one of the first and second semiconductor chips is provided with a non-conducting pad that is not connected to a wiring circuit,
   a spacer is bonded between the non-conducting pad and the substrate, the spacer being formed of a combination of a dummy bump and a dummy pad,
   each of the upper side pads opposes one of the lower side pads or a dummy pad provided on the substrate lower surface, and
   each of the lower side pads opposes one of the upper side pads or a dummy pad provided on the substrate upper surface.

4. A semiconductor chip assembly, comprising:
   a first semiconductor chip having a plurality of electrode pads and a non-conducting pad that is not connected to a wiring circuit;
   a second semiconductor chip having a plurality of electrode pads and a non-conducting pad that is not connected to a wiring circuit; and
   a substrate having upper side pads provided on a substrate upper surface at positions corresponding to the electrode pads of the first semiconductor chip and lower side pads provided on a substrate lower surface at positions corresponding to the electrode pads of the second semiconductor chip, wherein the upper side pads and the electrode pads of the first semiconductor chip are bonded together via first bumps, respectively, the lower side pads and the electrode pads of the second semiconductor chip are bonded together via second bumps, respectively, the non-conducting pads of the first and second semiconductor chips and the substrate are bonded together via spacers, respectively, each spacer being formed of a combination of a dummy bump and a dummy pad, each of the upper side pads opposes one of the lower side pads or a dummy pad provided on the substrate lower surface, and each of the lower side pads opposes one of the upper side pads or a dummy pad provided on the substrate upper surface.

5. A fabrication method for a semiconductor chip assembly, comprising:

temporarily fixing a first semiconductor chip onto a substrate, the first semiconductor chip having a plurality of electrode pads with first bumps bonded thereto, the first semiconductor chip also having a non-conducting pad that does not connect to a wiring circuit, and that bonds with a spacer, the first bumps being aligned with upper side pads on a substrate upper surface;

temporarily fixing a second semiconductor chip onto the substrate, the second semiconductor chip having a plurality of electrode pads with second bumps bonded thereto, the second semiconductor chip also having a non-conducting pad that does not connect to a wiring circuit, and that bonds with a spacer, the second bumps being aligned with lower side pads on a substrate lower surface; and pressing each of the first and second semiconductor chips toward the substrate under heat, thereby allowing the spacers to be directly bonded to the substrate, each spacer being formed of a combination of a dummy bump and a dummy pad, wherein each of the upper side pads opposes one of the lower side pads or a dummy pad provided on the substrate lower surface, and each of the lower side pads opposes one of the upper side pads or a dummy pad provided on the substrate upper surface.

* * * * *